United States Patent
Sakurai et al.

(10) Patent No.: US 6,875,696 B2
(45) Date of Patent: Apr. 5, 2005

(54) ULTRASONIC-WAVE WASHING UNIT, ULTRASONIC-WAVE WASHING APPARATUS, ULTRASONIC-WAVE WASHING METHOD, METHOD OF MANUFACTURING A SEMICONDUCTOR DEVICE, AND METHOD OF MANUFACTURING A LIQUID CRYSTAL DISPLAY

(75) Inventors: Naoaki Sakurai, Yokohama (JP); Hiroshi Fujita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 10/443,012

(22) Filed: May 22, 2003

(65) Prior Publication Data

US 2004/0200500 A1 Oct. 14, 2004

(30) Foreign Application Priority Data

May 23, 2002 (JP) ........................................ 2002-149130

(51) Int. Cl.[7] ..................... H01L 21/302; H01L 21/461; H01L 21/26; H01L 21/324; H01L 21/477
(52) U.S. Cl. ........................ 438/692; 438/693; 438/795
(58) Field of Search ................................. 438/692, 693, 438/795, 798, 745, 716; 134/184, 186, 1

(56) References Cited

U.S. PATENT DOCUMENTS

| | | | | |
|---|---|---|---|---|
| 5,203,362 A | * | 4/1993 | Shibata ....................... 134/184 |
| 6,189,547 B1 | * | 2/2001 | Miyamoto et al. .......... 134/184 |
| 6,216,364 B1 | * | 4/2001 | Tanaka et al. ................. 34/448 |
| 6,230,722 B1 | * | 5/2001 | Mitsumori et al. .......... 134/186 |
| 6,266,836 B1 | * | 7/2001 | Gallego Juarez et al. ....... 134/1 |
| 6,283,835 B1 | * | 9/2001 | Harada et al. ....... 257/E21.228 |
| 6,325,081 B1 | * | 12/2001 | Miki et al. ............... 134/102.1 |
| 6,431,184 B1 | * | 8/2002 | Taniyama .................... 134/1.3 |
| 6,517,635 B2 | * | 2/2003 | Mitsumori et al. ............. 134/1 |
| 6,750,145 B2 | * | 6/2004 | Crevasse et al. ............ 438/692 |
| 6,774,047 B2 | * | 8/2004 | Funabashi ................... 438/745 |
| 6,790,783 B1 | * | 9/2004 | Gilton et al. ............... 438/716 |
| 6,805,751 B2 | * | 10/2004 | Allen ......................... 438/795 |

FOREIGN PATENT DOCUMENTS

JP            7-283183       10/1995

\* cited by examiner

*Primary Examiner*—John F. Niebling
*Assistant Examiner*—Walter L. Lindsay, Jr.
(74) *Attorney, Agent, or Firm*—Finnegan, Henderson, Farabow, Garrett & Dunner, L.L.P.

(57) ABSTRACT

An ultrasonic-wave washing unit comprising an ultrasonic-wave vibrating plate to which an ultrasonic-wave vibrator is fixed by adhesive bonding, an ultrasonic-wave transmission plate opposed to the vibrating plate, a liquid supply means which supplies a liquid to a space defined between the vibrating plate and the transmission plate, and a liquid discharge means for discharging the liquid from the space.

8 Claims, 5 Drawing Sheets

100Hz
(Constant-frequency)

200Hz
(Constant-frequency)

1000Hz
(Constant-frequency)

Phase shift at for 180° | 80 pulses | 80 pulses 40 pulses, 749kHz | 80 pulses, 1590kHz | 40 pulses, 749kHz 80 pulses, 30W | 80 pulses, 50W | 80 pulses, 30W

ULTRASONIC-WAVE WASHING UNIT, ULTRASONIC-WAVE WASHING APPARATUS, ULTRASONIC-WAVE WASHING METHOD, METHOD OF MANUFACTURING A SEMICONDUCTOR DEVICE, AND METHOD OF MANUFACTURING A LIQUID CRYSTAL DISPLAY

CROSS-REFERENCE TO RELATED APPLICATIONS

This application is based upon and claims the benefit of priority from the prior Japanese Patent Application No. 2002-149130, filed May 23, 2002, the entire contents of which are incorporated herein by reference.

BACKGROUND OF THE INVENTION

1. Field of the Invention

The present invention relates to an ultrasonic-wave washing unit, ultrasonic-wave washing apparatus, and ultrasonic-wave washing method that are suitably used to wash a to-be-washed object, such as a semiconductor substrate, e.g., a silicon wafer or compound semiconductor wafer, which forms a semiconductor device, or a glass substrate, which forms a liquid crystal display, and a method of manufacturing a semiconductor device and a method of manufacturing a liquid crystal display to which these washing techniques are applied.

2. Description of the Related Art

In a manufacturing process for a semiconductor substrate or glass substrate for liquid crystal display, submicron particles and the like that adhere to the semiconductor substrate or glass substrate must be removed by washing before and after various precision works. Accordingly, an ultrasonic-wave washing method is available in which a to-be-washed object is washed with a detergent that is supplied with high-frequency ultrasonic waves of 500 kHz to 3.0 MHz, which are little damaging.

More specifically, according to this washing method, an ultrasonic-wave diffuser that transmits and diffuses ultrasonic vibration from a vibrator is brought close a to-be-washed surface of the to-be-washed object, and the detergent is fed into the gap between the diffuser and the surface. As this is done, the to-be-washed object is washed with the detergent that is supplied with the ultrasonic waves.

The efficiency of ultrasonic-wave washing can be improved by enhancing ultrasonic-wave energy over the surface of the to-be-washed object. To attain this, a source of ultrasonic-wave oscillation is improved, or ultrasonic waves from the oscillation source are converged to enhance the ultrasonic-wave energy over the to-be-washed surface, as described in Jpn. Pat. Appln. No. 7-283183.

However, the output of the source of ultrasonic-wave oscillation can be increased only limitedly, and a vibrating plate, an ultrasonic-wave vibrator, and an adhesive agent that is used to bond these elements together are limited in life performance and reliability. In order to enhance the ultrasonic-wave energy, therefore, a method is used to converge the ultrasonic-wave output, thereby increasing the apparent value of the output.

Conventionally, as described above, the ultrasonic-wave energy to be applied to the to-be-washed surface is enhanced by converging the ultrasonic-wave output. Recently, however, wires and other patterns formed on substrates have become finer and finer. Therefore, high-frequency ultrasonic waves, which had conventionally been regarded as little damaging, have started to damage the patterns considerably. The inventor hereof closely examined the principle of occurrence of damage, and ascertained that ultrasonic waves generated from the ultrasonic-wave vibrator were converged on a certain point and energy of a level that breaks the wires or influences their crystals was produced on that point. Thus, convergence and synthesis of ultrasonic vibration, which had conventionally been carried out to increase the ultrasonic-wave energy, were found to be the cause of the damage.

If there is a wide gap between the ultrasonic-wave diffuser and the to-be-washed object, the necessary quantity of detergent to fill the gap increases, thus entailing higher cost. Accordingly, the diffuser must be brought as close to the surface of the to-be-washed object as possible. If the gap is too narrow, however, the surface of the object is finely undulating and its thickness is uneven. If the ultrasonic-wave washing unit is moved in a fixed height position, therefore, the diffuser and the to-be-washed object touch each other, so that the wires and the like on the surface of the object may be broken.

BRIEF SUMMARY OF THE INVENTION

The object of the present invention is to subject a to-be-washed object to ultrasonic-wave washing without damaging it.

An ultrasonic-wave washing unit according to the invention comprises: an ultrasonic-wave vibrator; diffusion means which diffuses ultrasonic vibration generated by means of the ultrasonic-wave vibrator; and cooling means which cools the diffusion means.

An ultrasonic-wave washing apparatus of the invention comprises retaining means which holds a to-be-washed object and an ultrasonic-wave washing unit movable relatively to a to-be-washed surface of the object, the ultrasonic-wave washing unit having diffusion means, which has one surface to which an ultrasonic-wave vibrator is fixed and the other surface opposed to the to-be-washed object and diffuses ultrasonic vibration from the ultrasonic-wave vibrator, and cooling means which cools the diffusion means, the ultrasonic-wave washing apparatus further comprising detergent supply means which supplies a detergent to the to-be-washed surface.

An ultrasonic-wave washing method of the invention comprises: a step of moving an ultrasonic-wave washing unit relatively to a to-be-washed surface of a to-be-washed object held by means of retaining means, the washing unit having diffusion means, which has one surface to which an ultrasonic-wave vibrator is fixed and the other surface opposed to the to-be-washed object and diffuses ultrasonic vibration from the ultrasonic-wave vibrator, and cooling means which cools the diffusion means, thereby bringing the other surface of the diffusion means to a given distance from the to-be-washed surface; a step of supplying a detergent to the to-be-washed surface, thereby filling the gap between the to-be-washed surface and the other surface of the diffusion means with the detergent; and a step of driving the ultrasonic-wave vibrator to diffuse and propagate the ultrasonic vibration propagated through the diffusion means to the to-be-washed surface, thereby washing the to-be-washed surface.

A method of manufacturing a semiconductor device of the invention comprises: a step of forming a gate insulating film on a semiconductor substrate; a step of forming a gate conductor on the gate insulating film; a step of forming a gate cap on the gate conductor; a step of etching the gate conductor to the depth of the gate insulating film in accordance with a mask pattern of the gate cap; and a step of washing the surface by using the aforesaid ultrasonic-wave washing method.

A method of manufacturing a liquid crystal display of the invention comprises: a step of successively forming an SiN film, $SiO_2$ film, and a-Si film on a glass substrate for the liquid crystal display; a step of annealing the a-Si film by means of a laser, thereby polymerizing the film; a step of etching the polymerized Si film, thereby forming an island of poly-Si; and a step of washing the surface by using the aforesaid ultrasonic-wave washing method.

An ultrasonic-wave washing apparatus of the invention, which washes a to-be-washed surface of a to-be-washed object with a detergent to which ultrasonic, waves are applied, comprises: retaining means which holds the to-be-washed object; an ultrasonic-wave washing unit opposed to the to-be-washed surface of the to-be-washed object held by the retaining means; and positioning means which positions the ultrasonic-wave washing unit with respect to the to-be-washed surface of the to-be-washed object, the ultrasonic-wave washing unit including diffusion means which has one surface to which an ultrasonic-wave vibrator is fixed and the other surface opposed to the to-be-washed object and diffuses ultrasonic vibration from the ultrasonic-wave vibrator; detergent supply means which supplies a detergent to the to-be-washed surface of the to-be-washed object; and measuring means which measures a relative distance between the diffusion means and the to-be-washed surface, the positioning means having control means which positions the ultrasonic-wave washing unit so as to maintain a given distance between the diffusion means and the to-be-washed surface in accordance with the output of the measuring means.

An ultrasonic-wave washing method of the invention comprises: a positioning step of moving an ultrasonic-wave washing unit relatively to a to-be-washed surface of a to-be-washed object, the washing unit having diffusion means which has one surface to which an ultrasonic-wave vibrator is fixed and the other surface opposed to the to-be-washed object and diffuses ultrasonic vibration from the ultrasonic-wave vibrator, thereby bringing the other surface of the diffusion means to a given distance from the to-be-washed surface; a detergent supply step of supplying a detergent to the to-be-washed surface, thereby filling the gap between the to-be-washed surface and the other surface of the diffusion means with the detergent; a washing step of driving the ultrasonic-wave vibrator to diffuse and propagate the ultrasonic vibration propagated through the diffusion means to the to-be-washed surface, thereby washing the to-be-washed surface; and a measuring step of measuring a relative distance between the other surface-of the diffusion means and the to-be-washed surface, the positioning step having a control step of maintaining a given distance between the diffusion means and the to-be-washed surface in accordance with the relative distance measured in the measuring step.

DETAILED DESCRIPTION OF THE INVENTION

Figure 1:
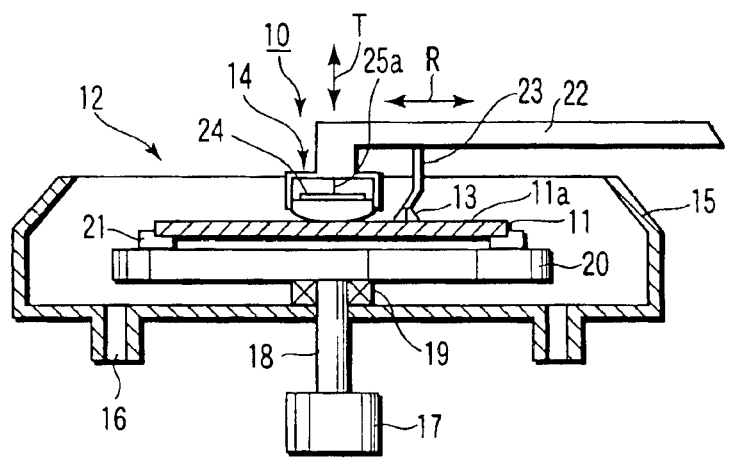
FIG. 1 is a sectional view of an ultrasonic-wave washing apparatus of a leaf-spin washing type according to the present invention.
Figure 2:
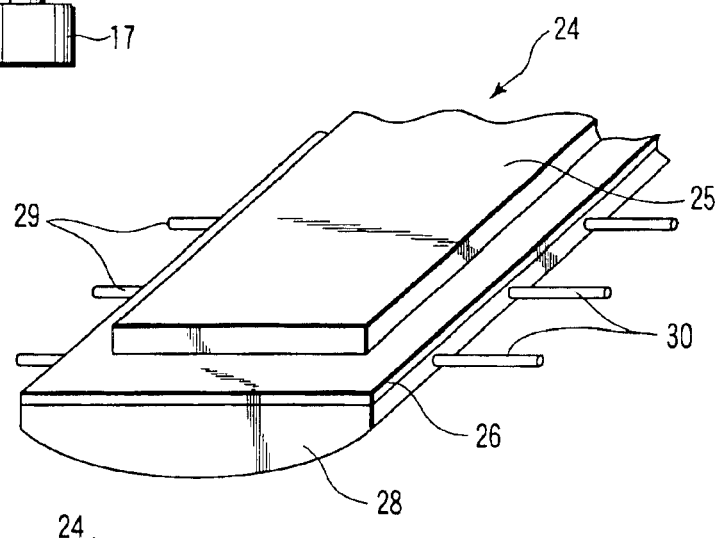
FIG. 2 is a partial perspective view of an ultrasonic-wave washing unit.
Figure 3:
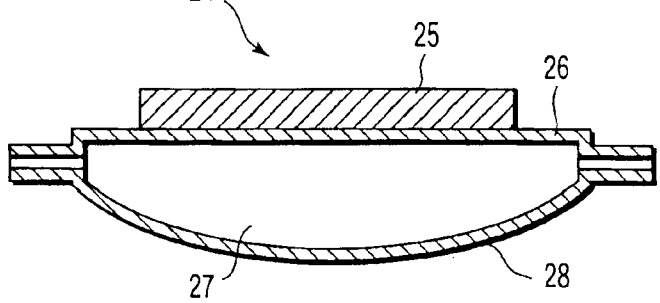
FIG. 3 is a sectional view of the ultrasonic-wave washing unit.
Figure 4:
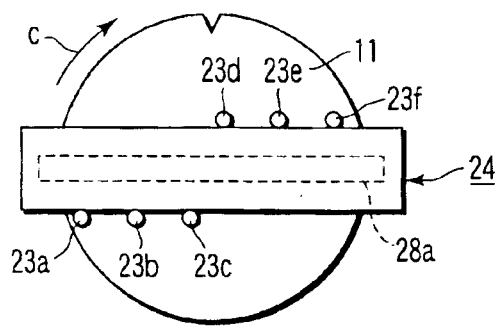
FIG. 4 is a plan view showing the relation between a to-be-washed object and the ultrasonic-wave washing unit.
Figure 5:
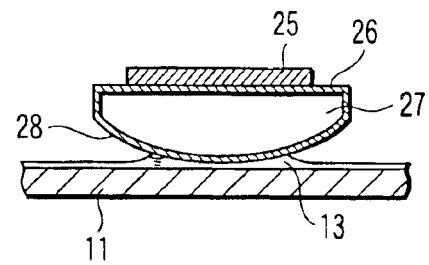
FIG. 5 is a vertical sectional view showing the relation between the to-be-washed object and the ultrasonic-wave washing unit.

An ultrasonic-wave washing unit according to a first embodiment of present invention and an ultrasonic-wave washing apparatus using the same will now be described with reference to the accompanying drawings. FIG. 1 is a sectional view of the ultrasonic-wave washing apparatus of a leaf-spin washing type of the invention. FIG. 2 is a partial perspective view of the ultrasonic-wave washing unit. FIG. 3 is a sectional view of the ultrasonic-wave washing unit. FIG. 4 is a plan view showing the relation between a to-be-washed object and the ultrasonic-wave washing unit. FIG. 5 is a vertical sectional view.

An ultrasonic-wave washing apparatus 10 comprises a spinning device 12 and an ultrasonic-wave washing unit 14.

The spinning device 12 holds a to-be-washed object 11, such as a silicon wafer or some other semiconductor substrate, glass substrate for a liquid crystal display, etc. The washing unit 14 supplies a detergent 13 to the object 11 and applies ultrasonic waves to the detergent 13, thereby washing a to-be-washed surface 11a of the object 11.

In FIG. 1, numeral 15 denotes a cup in the form of a bottomed cylinder. The bottom of the cup 15 is provided with discharge ports 16 through which the detergent 13 is discharged. The upper part of the cup 15 is inclined toward its center in order to prevent the detergent 13 scattered from the to-be-washed object 11 from being reflected by the inner wall of the cup 15 and rebounded on the object 11 and to guide the detergent 13 to the discharge ports 16. A rotating shaft 18 that is coupled to the shaft of a motor 17 substantially penetrates the center of the lower part of the cup 15. The shaft 18 is rotatably supported by means of a bearing 19 that is attached to the cup 15. The center of rotation of a rotating stage 20 is fixed to the top of the shaft 18. A plurality of support pins 21 are arranged at equal spaces in a ring along the outer periphery of the stage 20. The pins 21 fixedly support the object 11. The rotating stage 20 and the support pins 21 constitute retaining means.

An arm 22 is located in a position opposite the to-be-washed surface 11a of the to-be-washed object 11. It is movable in the direction of arrow T (direction toward and away from the object 11) and the direction of arrow R (direction parallel to the surface 11a). The ultrasonic-wave washing unit 14 is mounted on the distal end portion of the arm 22. The washing unit 14 comprises nozzles 23 and an ultrasonic-wave application means 24. The nozzles 23 supply the detergent 13 to the to-be-washed surface 11a of the object 11. The ultrasonic-wave application means 24 applies ultrasonic waves to the detergent 13 on the surface 11a.

Although only one nozzle 23 is shown in FIG. 1, a plurality of nozzles 23 should preferably be arranged in the manner shown in FIG. 4. More specifically, the detergent 13 is supplied to the upper-stream side of the to-be-washed object 11 that faces the ultrasonic-wave application means 24 when the object 11 rotates in the direction of arrow C. In FIG. 1, three nozzles 23a, 23b and 23c are arranged under the application means 24 on the left-hand side of the object 11. On the right-hand side of the object 11, three nozzles 23d, 23e and 23f are arranged over the application means 24. With this arrangement, the ultrasonic waves can be efficiently applied to the detergent 13, so that the washing effect can be improved.

Since the to-be-washed object 11 is rotated according to the present embodiment, the nozzles 23 are arranged in the manner described above. If the object 11 is transported straight by means of a belt conveyor, for example, the nozzles 23 should only be arranged on the upper-stream side of the ultrasonic-wave application means 24 with respect to the direction of transportation of the object 11. The location of the nozzles 23 is not limited to the case of the present embodiment, and they may be located in any other suitable positions such that the surface of the object 11 can be sufficiently supplied with the detergent.

According to the present embodiment, moreover, the nozzles 23 are arranged separately from the ultrasonic-wave application means 24. Alternatively, however, they may be formed integrally with the application means 24 or designed so that the detergent 13 can be supplied to the to-be-washed object 11 along the surface of an ultrasonic-wave transmission plate 28 (mentioned later).

Preferably, the detergent 13 should be discharged from the nozzles 23a to 23f at different rates. More specifically, the to-be-washed object 11 rotates in the direction of arrow C, so that the detergent 13 that is supplied to the center of the object 11 is caused to flow toward the outer periphery by centrifugal force. In order to supply the detergent 13 substantially uniformly to the surface of the to-be-washed surface 11a of the object 11, therefore, the detergent 13 is discharged at the highest rate from the nozzles 23c and 23d on the center side of the object 11, at the second highest rate from the nozzles 23b and 23e, and at the lowest rate from the nozzles 23a and 23f.

Since the to-be-washed object 11 is rotated according to the present embodiment, the detergent is discharged at different rates from the nozzles 23a to 23f, as described above. If the object 11 is transported straight, however, the detergent may be discharged at the same rate.

As is shown in detail in FIGS. 2 and 3, the ultrasonic-wave application means 24 includes ultrasonic-wave diffusion means, which is composed of an ultrasonic-wave vibrator 25 based on lead titanate, for example, an ultrasonic-wave vibrating plate 26, and the ultrasonic-wave transmission plate 28. The vibrating plate 26, to which the vibrator 25 is bonded, transmits vibration of the vibrator 25. The transmission plate 28 is opposed to the vibrating plate 26 and, in conjunction with the vibrator 25, defines a space 27. The vibrator 25 may be a piezoelectric device.

The oscillation frequency of the ultrasonic-wave vibrator 25 ranges from 500 kHz to 8 MHz. It generates heat as it vibrates. If the ultrasonic-wave vibrating plate 26 is non-loaded, the vibrator 25 may be destroyed by its own vibration and heat generation. Further, the heat generation causes an adhesive agent (e.g., epoxy thermosetting adhesive agent) that bonds the vibrator 25 and the vibrating plate 26 together to reach a temperature corresponding to its heat resistance or higher temperature. Inevitably, therefore, the state of bond is worsened, so that the transmission of ultrasonic vibration suffers a loss.

Accordingly, the ultrasonic-wave transmission plate 28 is provided with coolant supply ports (liquid supply means) 29, through which a coolant (liquid) such as water is fed into the space 27, and coolant discharge ports (liquid discharge means) 30, through which the coolant is discharged. These ports serve as means for applying load to the ultrasonic-wave vibrating plate 26 and as cooling means for cooling the adhesive agent that bonds the vibrator 25 and the vibrating plate 26 together.

In carrying out ultrasonic-wave washing, moreover, the washing effect can be improved if the temperature of the detergent is high. If the high-temperature detergent directly touches the ultrasonic-wave vibrating plate 26 to which the ultrasonic-wave vibrator 25 is bonded, however, the durability of the adhesive agent that bonds them is extremely lowered, so that the detergent cannot be heated to high temperature. As ultrasonic waves are applied to the detergent that indirectly touches the ultrasonic-wave transmission plate 28 through the medium of the aforesaid coolant, however, thermal damage to the adhesive agent need not be considered, so that a high-temperature detergent can be utilized.

The number of coolant supply and discharge ports 29 and 30 may be suitably selected depending on the size of the ultrasonic-wave washing unit 14. These ports 29 and 30 are connected to a source of coolant supply and coolant discharge means (not shown) through the interior of the arm 22.

For example, an RF power source (not shown) is connected to the ultrasonic-wave vibrator 25 by means of a supply line 25a. Generation of ultrasonic vibration is controlled by driving the RF power source. The ultrasonic-wave vibrating plate 26 is formed of a flat quartz plate, single-crystal sapphire, SiC, alumina, SUS, or Ta plate. The ultrasonic-wave transmission plate 28 is convex on the side opposite from the vibrating plate 26. Like the vibrating plate 26, it is formed of quartz, single-crystal sapphire, SiC, alumina, SUS, or Ta plate. Since the transmission plate 28 directly touches the detergent 13, its constituents may possibly liquate out and contaminate the to-be-washed object 11, depending on the kind of the detergent. Therefore, the material of the transmission plate 28 must be suitably selected according to the kind of the detergent 13 used.

As shown in FIG. 4, the length of the ultrasonic-wave application means 24 is a little greater than the diameter of the to-be-washed object 11 (silicon wafer). As the object 11 rotates for 180° in this arrangement, its whole surface can be washed in the main. However, the length of the application means 24 may be suitably changed depending on the size of the object 11. If the object 11 is circular, as shown in FIG. 4, for example, the length of the application means 24 may be made a little greater than the diameter of the object 11, as described above, or than its radius, so that the range from the center of rotation to the outer periphery can be covered. Alternatively, the application means 24 may be made so small that ultrasonic vibration can be applied spottedly. If the to-be-washed object 11 is a square substrate (e.g., glass substrate for liquid crystal display) that is transported straight, its whole surface can be efficiently washed in the main as it passes under the application means 24 provided that the length of the application means 24 is a little greater than the width of the object 11. A region 28a indicated by broken line in FIG. 4 represents a portion in which the ultrasonic-wave transmission plate 28 (mentioned later) and the object 11 connect with each other by means of the detergent 13.

The principle of washing in the ultrasonic-wave washing apparatus 10 will now be described also with reference to FIG. 5. The gap between the to-be-washed surface 11a of the to-be-washed object 11 and the ultrasonic-wave transmission plate 28 of the ultrasonic-wave application means 24 is approximated to 0.5 mm or more, e.g., to about 1 mm, and the detergent 13 is supplied to the gap. If this is done, the detergent 13 touches the transmission plate 28 and uses its surface tension to form a convex on the plate 28, as shown in FIG. 5. On the other hand, vibration that is produced by the ultrasonic-wave vibrator 25 is transmitted from the ultrasonic-wave vibrating plate 26 to the transmission plate 28 through the coolant that fills the space 27. The ultrasonic waves having reached the transmission plate 28 are radially diffused by the curved convex of the transmission plate 28 and applied to the detergent 13. Thus, the ultrasonic waves that are diffused by the transmission plate 28 never converge on the detergent 13 or the to-be-washed surface 11a, and no convergent points for ultrasonic energy that surpasses energy generated for each unit area can be produced. In consequence, the ultrasonic waves can be restrained from damaging any convex structures such as wires on the surface 11a or members that are exposed in the surface of the object 11.

The following is a description of a washing method that utilizes the ultrasonic-wave washing apparatus 10 constructed in this manner. First, the to-be-washed object (e.g., silicon wafer) 11 is delivered to and fixedly supported on the support pins 21 that are arranged in a ring on the rotating stage 20 from which the arm 22 is evacuated. As this is done, the ultrasonic-wave application means 24 is moved to washing means (not shown) that is located outside the cup 15, whereupon the surface of the ultrasonic-wave transmission plate 28 that is in contact with the detergent 13 can be washed. Then, the arm 22 is rocked and driven to move the ultrasonic-wave washing unit 14 horizontally over the to-be-washed object 11 and further to lower it so that a given gap is formed between the surface of the object 11 and the apex of the transmission plate 28 of the application means 24.

After the to-be-washed object 11 and the ultrasonic-wave application means 24 are situated in a given relation, the motor 17 is driven to rotate the object 11 in the direction of arrow C so that the detergent 13 is supplied to the to-be-washed surface. 11a of the object 11 through the nozzles 23a to 23f. When the detergent 13 is fed in a given quantity onto the surface 11a, it fills the gap between the ultrasonic-wave transmission plate 28 and the surface 11a and connects them in the region 28a, as shown in FIG. 5. If the ultrasonic-wave vibrator 25 is actuated in this state, ultrasonic vibration is transmitted to the to-be-washed surface 11a of the object 11 through the ultrasonic-wave vibrating plate 26, coolant that fills the space 27, transmission plate 28, and detergent 13. Thus, the ultrasonic vibration can remove particles and the like that adhere to the surface 11a. After the washing operation, the detergent 13 is scattered toward the outer periphery by centrifugal force that is produced as the object 11 rotates and is discharged from the discharge ports 16.

The following is a description of a method of driving the ultrasonic-wave vibrator 25. Recently, wires formed on the surface of substrates such as silicon wafers have been made finer and finer. In some cases, therefore, the wires may be damaged even by ultrasonic waves in a band that has conventionally been nondamaging. According to the present embodiment, the ultrasonic waves are applied not continuously but repeatedly in an on-off manner. In an alternative method, ultrasonic waves of a plurality of types having different phases, wavelengths, or amplitudes are changed by stages and applied continuously. This method will now be described specifically.

Figure 6A:
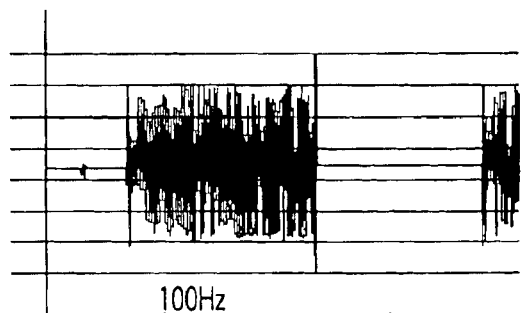
FIGS. 6A, 6B and 6C are diagrams showing the waveforms of ultrasonic waves repeatedly applied in an on-off manner.
Figure 6B:
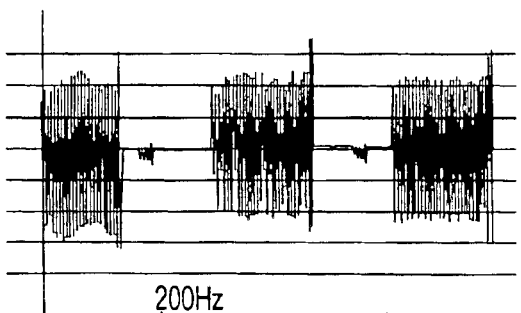
Figure 6C:
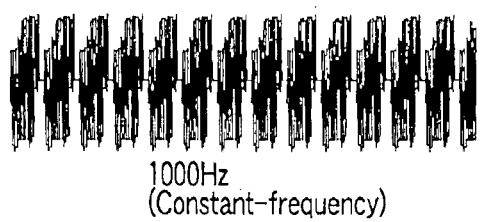

FIGS. 6A, 6B and 6C show the waveforms of ultrasonic waves that are repeatedly applied in an on-off manner. FIG. 6A shows a case in which carrier waves of 100 Hz are superimposed on ultrasonic waves. FIG. 6B shows a case in which carrier waves of 200 Hz are superimposed, and FIG. 6C shows a case in which carrier waves of 1,000 Hz are superimposed. As the ultrasonic waves are thus repeatedly applied in an on-off manner, crystals that constitute the wires and substrates resonate with the on-state ultrasonic waves. When the application of the ultrasonic waves is switched off in a given time, however, the resonance is stopped. Thus, the resonance can be prevented from attaining a level such that it damages the wires or crystals.

Figure 7A:
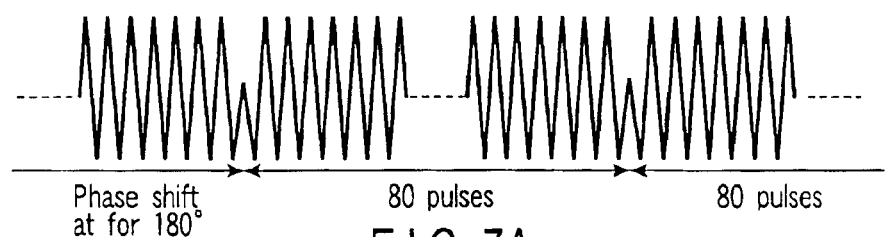
FIG. 7A is a diagram showing the waveform of ultrasonic waves of which the phase is shifted by 180° during continuous irradiation.
Figure 7B:
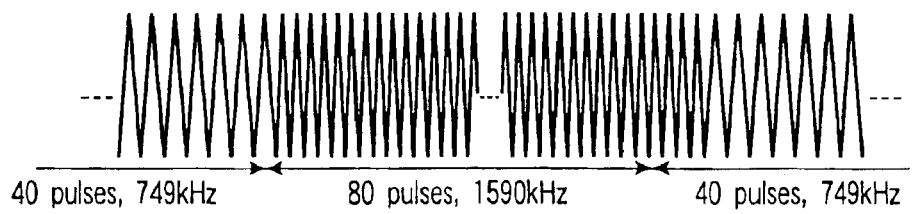
FIG. 7B is a diagram showing the waveform of ultrasonic waves of which the wavelength (pulse width) is changed during the continuous irradiation.
Figure 7C:
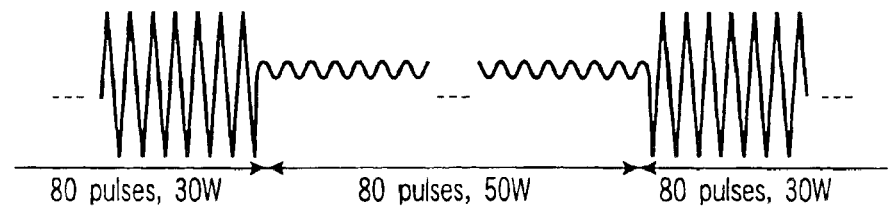
FIG. 7C is a diagram showing the waveform of ultrasonic waves of which the amplitude (pulse output) is changed during the continuous irradiation.

FIGS. 7A, 7B and 7C show the waveforms of a plurality of ultrasonic waves with different phases, wavelengths, and amplitudes that are applied continuously, not in an on-off manner. FIG. 7A shows a case in which the phase is shifted for 180° with every 80 pulses during the continuous irradiation. FIG. 7B shows a case in which the wavelength (pulse width) is changed during the continuous irradiation and 80 pulses of 1,590 Hz and 40 pulses of 749 Hz are applied alternately. If the changed wavelength is an integral multiple or submultiple of the original wavelength, in this case, however, resonance occurs inevitably, so that the wavelength should be of any other value. FIG. 7C shows a case in which the amplitude (pulse output) is changed with every given time with the phase unchanged during the continuous irradiation and 80 pulses of 30 Hz and 80 pulses of 5 Hz are applied alternately. According to these methods of irradiation, ultrasonic waves that cancel the resonance in the wires and crystals are changed as they are applied. Thus, the incidence of damage can be lowered to a hundredth of a value for the case where specific ultrasonic waves continue to be applied. In the case described above, ultrasonic waves of two types are changed as they are applied. Alternatively, however, ultrasonic waves of three or more types may be changed as they are applied. Alternatively, moreover, ultrasonic waves of a plurality of types may be superposed so that the types are changed with every given timing to restrain resonance.

The ultrasonic-wave vibrator 25, vibrating plate 26, transmission plate 28, and the adhesive agent that bonds the vibrator 25 and the vibrating plate 26 deteriorate with time. Therefore, the state of the ultrasonic waves in the gap between the transmission plate 28 and the to-be-washed surface 11a or in the space 27 is detected by means of a sensor. Based on the result of this detection, the RF power source that drives the vibrator 25 is subjected to feedback control, and the timing for the replacement of each component can be recognized.

The following is a description of the case where the ultrasonic-wave washing method of the present embodiment is applied to an active area of a semiconductor device and the manufacture of a liquid crystal cell of a liquid crystal display.

Figure 8A:
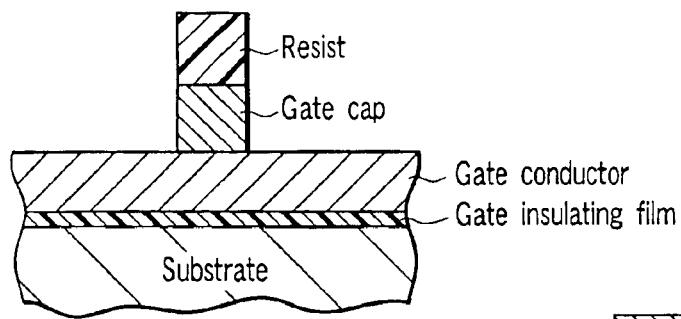
FIGS. 8A, 8B and 8C are views showing steps of forming an active area and a gate conductor in a manufacturing process for a semiconductor device.
Figure 8B:
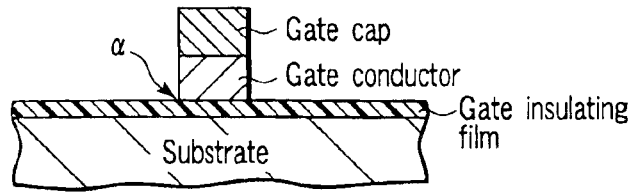
Figure 8C:
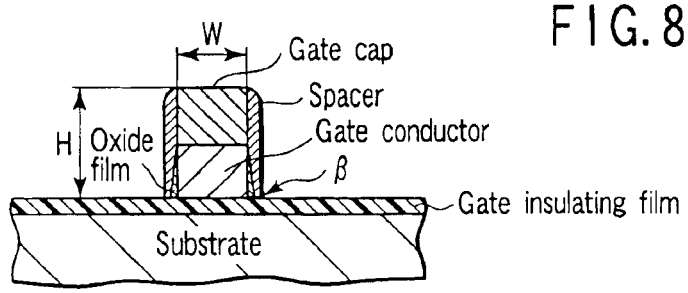

FIGS. 8A, 8B and 8C are views showing steps of forming the active area and a gate conductor in a manufacturing process for the semiconductor device. If the design rule is not very tight, damage to the wires and the like is not a critical problem. It is known, however, that the wires and the like are liable to damage if the design rule is as tight as the level of 0.2 μm.

First, a gate insulating film (gate oxide film) is formed on a semiconductor substrate that is formed of a silicon wafer, for example, and the gate conductor is formed on the insulating film. Subsequently, an SiN film that constitutes a gate cap, for example, is formed on the gate conductor, and a resist film is formed on the SiN film. Then, the resist film is exposed and developed to be patterned, whereupon a mask is formed. Thereafter, the SiN film is etched to form the gate cap (FIG. 8A). Then, the resist film having been used as the mask is removed, and the surface is washed. Thereafter, the gate conductor is etched to the depth of the gate insulating film in accordance with a mask pattern of the gate cap (FIG. 8B). After the surface is washed, a spacer of an oxide film is formed around the sidewall of the gate (FIG. 8C), whereupon the gate of, for example, a DRAM is completed.

In the manufacturing process for the semiconductor device described above, the surface must be cleaned in order to form another layer thereon after an etching step or the like. The ultrasonic-wave washing method of the present invention is an effective method to meet this requirement. If the design rule is on the level of 0.2 μm (0.7 μm or less for a metallic wire) and if the aspect ratio (H/W in FIG. 8C) is 1 or more, a wire is inevitably flattened in a portion indicated by symbol α in FIG. 8B or symbol β in FIG. 8C according to the conventional ultrasonic-wave washing method. Thus, according to the conventional method, the incidence of defective patterns increases, and the yield rate may possibly lower to 50% or less. According to the ultrasonic-wave washing method of the present invention, on the other hand, damage to the wires and the like can be minimized, and the yield rate can be approximated to 100%.

The following is a description of an example of a step of forming a gate on the glass substrate that constitutes the liquid crystal cell of the poly-Si-TFT liquid crystal display. The processing area of the liquid crystal display is greater than that of the semiconductor device. The opening of the display is expected to be widened in order to improve the display capacity. Thus, the pixel section must be increased, and peripheral circuit sections, such as a driver, must be reduced in size.

After the SiN film, an $SiO_2$ film, and an a-Si film are formed, in a fundamental step, the surface of the a-Si film is washed. Thereafter, the a-Si film is annealed to be polymerized by means of a laser, whereupon a mask is formed. After the poly-Si film is etched to form an island of poly-Si that serves as the gate, its surface is washed. After an insulating film and a metal film are formed on the surface of the glass substrate that includes the poly-Si island, a resist is spread and exposed to form a mask, and the metal film is etched to form a gate wire.

In the manufacturing process for the liquid crystal display, a wider area than in the semiconductor device must be washed in a short time, so that ultrasonic-wave washing requires high power. In the case of the conventional ultrasonic-wave washing method, the glass substrate has about ten damaged regions, which are few. Since the liquid crystal display has no redundant circuits, however, it can be fatally affected by a single damaged region. It is empirically recognized that the number of damaged regions can be reduced substantially to zero according to the ultrasonic-wave washing method of the present embodiment.

If the ultrasonic-wave washing is carried out in this manner by using the ultrasonic-wave washing apparatus according to the present embodiment, damage to the wires or to the crystalline state of substances that constitute the substrates and the like can be minimized, and the yield rate in the manufacturing processes for the semiconductor device and liquid crystal display can be improved considerably.

Figure 9:
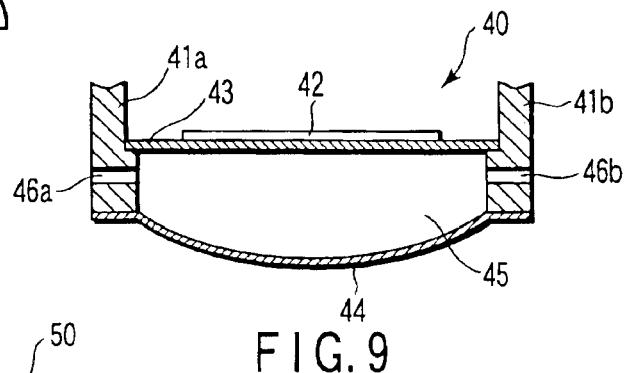
FIG. 9 is a view showing a first modification of an ultrasonic-wave application means.

The following is a description of modifications of the ultrasonic-wave application means according to the embodiment described above. FIG. 9 shows a first modification of the ultrasonic-wave application means 24. Ultrasonic-wave application means 40 has a pair of support portions 41a and 41b. Between the support portions 41a and 41b, a space 45 is defined by a part of each support portion, an ultrasonic-wave vibrating plate 43, an ultrasonic-wave transmission plate 44, and a pair of side plates (not shown). An ultrasonic-wave vibrator 42 is fixed to the vibrating plate 43 by adhesive bonding. The transmission plate 44 is a plate member that in convex on one side. The one support portion 41a is provided with a coolant supply port 46a (or a plurality of ports 46a arranged in the longitudinal direction of the application means 40) through which the coolant is introduced into the space 45. The other support portion 41b is provided with a coolant discharge port 46b (or a plurality of ports 46b arranged in the same manner as the supply ports 46a) through which the coolant is discharged. The ultrasonic-wave application means 40 constructed in this manner facilitates manufacture. Since the members are constructed independently, moreover, the maintenance and the replacement of the members can be carried out smoothly and easily.

Figure 10:
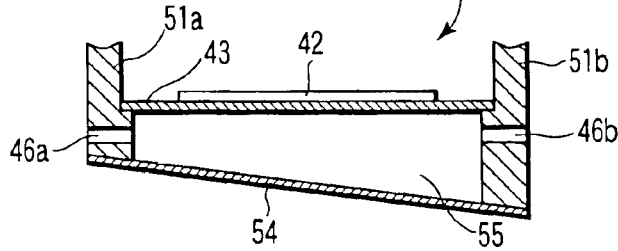
FIG. 10 is a view showing a second modification of the ultrasonic-wave application means.

FIG. 10 shows a second modification of the ultrasonic-wave application means. Like numerals are used to designate like portions of the first and second modifications, and a description of those portions is omitted. Ultrasonic-wave application means 50 has a pair of support portions 51a and 51b. Between the support portions 51a and 51b, a space 55 is defined by a part of each support portion, an ultrasonic-wave vibrating plate 43, an ultrasonic-wave transmission plate 54 in the form of a flat plate, and a pair of side plates (not shown). An ultrasonic-wave vibrator 42 is fixed to the vibrating plate 43 by adhesive bonding. This modification differs from the first modification in that the transmission plate 54 is a flat plate that is fixed at an angle to the vibrating plate 43. Ultrasonic vibration that is propagated to the to-be-washed object 11 through vibrating plate 43, the coolant in the space 55, and the transmission plate 54 from can be reflected and returned by the object 11. Owing to the aforesaid inclination, in this case, vibration from the vibrator 42 can prevent the reflected ultrasonic vibration from being redirected by the transmission plate 54 and damaging the vibrator 42 or the bond between the vibrator 42 and the vibrating plate 43. In consideration of the relation between the transmission of the vibration from the vibrating plate 43 and the reflected vibration, the mounting angle of the transmission plate 54 should be adjusted to about 2 to 20°, and preferably to about 15°.

Figure 11:
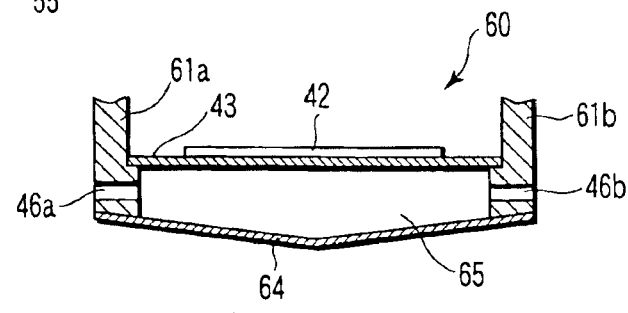
FIG. 11 is a view showing a third modification of the ultrasonic-wave application means.

FIG. 11 shows a third modification of the ultrasonic-wave application means. Like numerals are used to designate like portions of the first to third modifications, and a description of those portions is omitted. This modification differs from the aforesaid modifications in that an ultrasonic-wave transmission plate 64 is bent in a position substantially halfway between support portions 61a and 61b. With this arrangement, damage from the reflected vibration can be reduced in the same manner as in the second modification, and the space between the to-be-washed surface 11a of the to-be-washed object 11 and the transmission plate 64, which is to be filled with the detergent 13, can be widened. Thus, the washing efficiency can be made higher than in the second modification.

Figure 12:
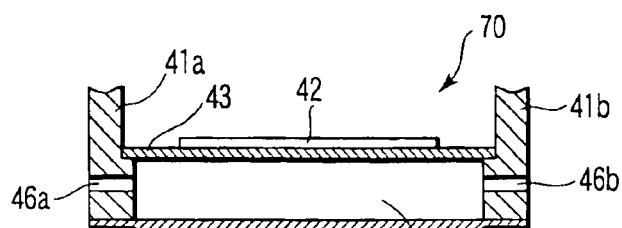
FIG. 12 is a view showing a fourth modification of the ultrasonic-wave application means.

FIG. 12 shows a fourth modification of the ultrasonic-wave application means. Like numerals are used to designate like portions of the first to fourth modifications, and a description of those portions is omitted. An ultrasonic-wave transmission plate 74 of this modification is different from the ultrasonic-wave transmission plate 44 of the first modification. The transmission plate 74 of the fourth modification is characterized in that its surface opposite an ultrasonic-wave vibrating plate 43 is flat and that its surface opposite the to-be-washed object 11 is in the form of a convex lens. With this arrangement, ultrasonic vibration given from the transmission plate 74 can be diffused more uniformly, so that energy on the to-be-washed surface 11a can be made uniform to reduce the difference in washing capacity.

Figure 13:
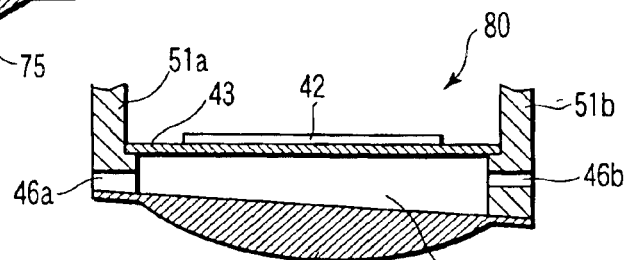
FIG. 13 is a view showing a fifth modification of the ultrasonic-wave application means.

FIG. 13 shows a fifth modification of the ultrasonic-wave application means. Like numerals are used to designate like portions of the first to fifth modifications, and a description of those portions is omitted. An ultrasonic-wave transmission plate 84 of this modification is different from the ultrasonic-wave transmission plate 54 of the second modification. The transmission plate 84 of the fifth modification is characterized in that its surface opposite an ultrasonic-wave vibrating plate 43 is flat and that its surface opposite the to-be-washed object 11 is in the form of a convex lens. This arrangement can produce the following effect besides the effect of the second modification. Ultrasonic vibration given from the transmission plate 84 can be diffused more uniformly, so that energy on the to-be-washed surface 11a can be made uniform to reduce the difference in washing capacity.

Figure 14A:
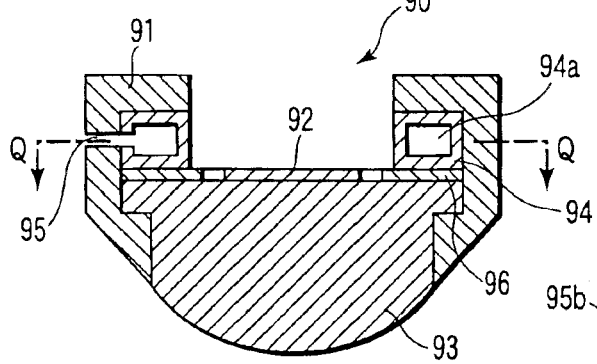
FIG. 14A is a view showing a sixth modification of the ultrasonic-wave application means.
Figure 14B:
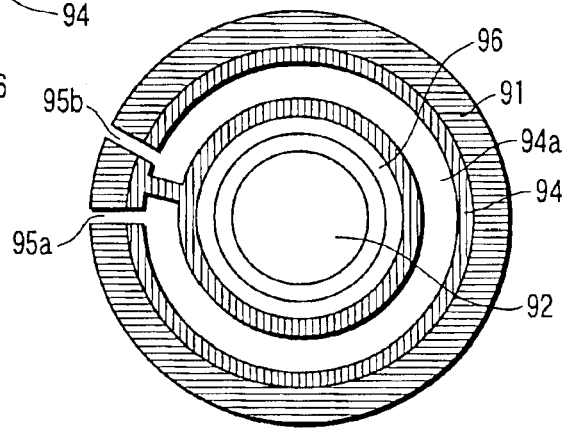
FIG. 14B is a sectional view taken along line Q—Q of FIG. 14A.

FIGS. 14A and 14B show a sixth modification of the ultrasonic-wave application means that can apply ultrasonic waves in spots. FIG. 14A is a vertical sectional view, and FIG. 14B is a sectional view taken along line Q—Q of 14A. Ultrasonic-wave application means 90 has a ring-shaped support portion 91. The support portion 91 has therein ultrasonic-wave diffusion means 93, one surface (lower surface in FIG. 14A) of which is convex (spherical in this modification) and the other surface of which is flat. The diffusion means 93 is formed of quartz, sapphire, SiC, alumina, SUS, or Ta. An ultrasonic-wave vibrator 92 is fixed substantially to the central portion of the other surface of the diffusion means 93 by adhesive bonding. A thermal conduction sheet 96, e.g., a Teflon sheet, is provided on the outer per of the vibrator 92. Ring-shaped cooling means 94, which has a coolant passage 94a therein, is located on the sheet 96. The passage 94a is provided with a coolant supply port 95a through which the coolant is supplied and a coolant discharge port 95b through which the coolant is discharged. With use of the application means 90 constructed in this manner, the diffusion means 93 can be cooled, and the vibrator 92 can be cooled together with the adhesive agent by means of the diffusion means 93. Further, the manufacture is easy, and the maintenance and the replacement of the members can be carried out smoothly and easily.

In the embodiment and the modifications described above, the ultrasonic-wave application means has a straight configuration, as shown in FIGS. 1 to 13, or is designed to be able to apply ultrasonic waves in spots, as shown in FIGS. 14A and 14B. However, these configurations may be combined freely and suitably used as required with the same effect.

Figure 15:
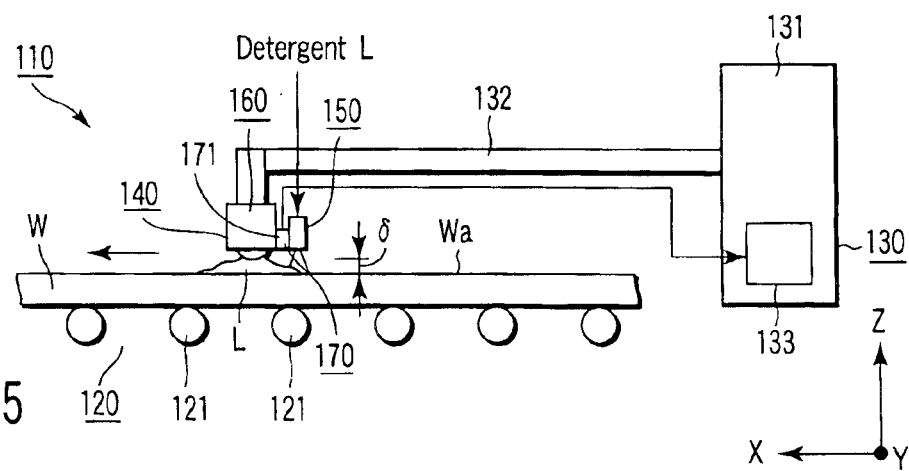
FIG. 15 is a side view of an ultrasonic-wave washing apparatus according to a second embodiment of the invention.
Figure 16:
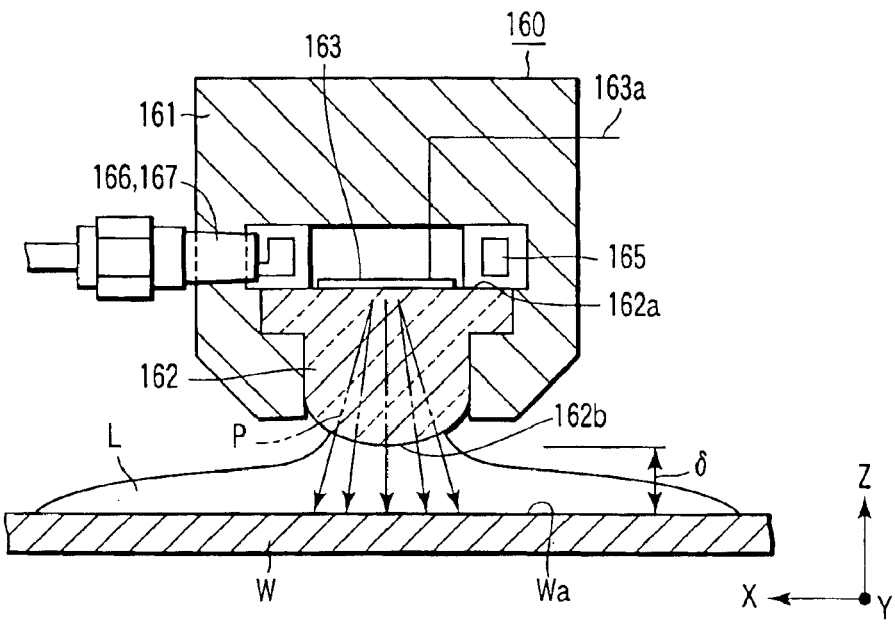
FIG. 16 is a vertical sectional view of an ultrasonic-wave washing unit incorporated in the ultrasonic-wave washing apparatus.
Figure 17:
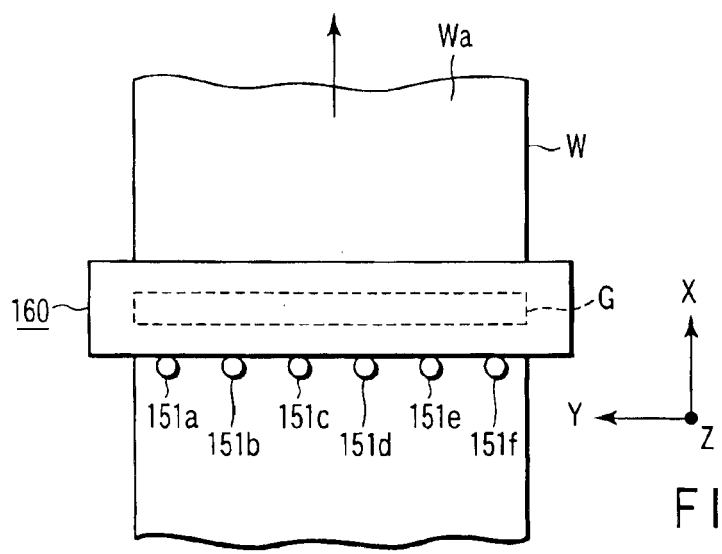
FIG. 17 is a plan view showing the relation between the ultrasonic-wave washing unit of the ultrasonic-wave washing apparatus and the to-be-washed object.

FIG. 15 is a side view showing an ultrasonic-wave washing apparatus 110 according to a second embodiment of the invention. FIG. 16 is a vertical sectional view showing an ultrasonic-wave washing unit incorporated in the washing apparatus 110. FIG. 17 is a plan view showing the relation between the washing unit of the washing apparatus 110 and the to-be-washed object. In these drawings, arrows X, Y and Z indicate three rectangular directions, individually. More specifically, the arrows X and Y indicate horizontal directions, and the arrow Z indicates a vertical direction.

The ultrasonic-wave washing apparatus 110 comprises a transportation mechanism 120, a positioning mechanism 130, and an ultrasonic-wave washing unit 140. The transportation mechanism 120 transports a semiconductor substrate, such as a silicon wafer, or a to-be-washed object W, such as a glass substrate for liquid crystal display. The positioning mechanism 130 positions the washing unit 140. The washing unit 140 supplies a detergent L to the object W and applies ultrasonic waves to the semiconductor, thereby washing a to-be-washed surface Wa of the object W.

The transportation mechanism 120 comprises a plurality of rotating drums 121 that are driven by means of a drive mechanism (not shown). The drums 121 serve to transport the to-be-washed object W in the direction of the arrow X.

The positioning mechanism 130 comprises an up-and-down motion mechanism 131, an arm 132, and a control circuit 133. The mechanism 131 positions the arm 132 with respect to its height direction (direction of the arrow Z). The arm 132 is supported on the mechanism 131, and the ultrasonic-wave washing unit 140 is mounted on the distal end of the arm 132. The circuit 133 controls the up-and-down motion mechanism 131 in accordance with the output of a non-contact distance sensor 171, which will be mentioned later.

The ultrasonic-wave washing unit 140 comprises a detergent supply section 150, an ultrasonic-wave application section 160, and a measuring section 170. The supply section 150 supplies the detergent L to the to-be-washed surface Wa of the to-be-washed object W. The application section 160 applies ultrasonic waves to the detergent L on the surface Wa. The measuring section 170 measures a gap δ between an ultrasonic-wave diffuser 162 of the application section 160 and the surface Wa.

As shown in FIG. 17, the detergent supply section 150 comprises a plurality of nozzles 151a to 151f, through which the detergent L is supplied to the upper-stream side of the to-be-washed object W that faces the ultrasonic-wave application section 160. With this arrangement, ultrasonic waves can be efficiently applied to the detergent L. Thus, the washing effect can be improved, and the detergent L can be saved.

According to the present embodiment, moreover, the supply section 150 is formed independently of the ultrasonic-wave application section 160. Alternatively, however, it may be formed integrally with the application section 160 or designed so that the detergent L can be supplied along the surface of the ultrasonic-wave diffuser 162 to the to-be-washed object W.

The ultrasonic-wave application section 160 has a support portion 161 of Teflon. The length (in the depth direction of FIGS. 15 and 16) of the support portion 161 will be mentioned later. The support portion 161 has therein an ultrasonic-wave diffuser 162, one surface 162a of which is flat and the other surface 162b of which is convex (spherical in this embodiment). The diffuser 162 is formed of quartz, for example. Alternatively, it may be formed of sapphire, SiC, alumina, SUS, or Ta. Since the diffuser 162 directly touches the detergent L, its constituents may possibly liquate out and pollute the to-be-washed object W depending on the kind of the detergent. Therefore, the material of the diffuser 162 must be suitably selected according to the kind of the detergent L used.

An ultrasonic-wave vibrator 163 is fixed substantially to the central portion of the one surface of the ultrasonic-wave diffuser 162. For example, an RF power source (not shown) is connected to the ultrasonic-wave vibrator 163 by means of a supply line 163a. Generation of ultrasonic vibration is controlled by driving the RF power source.

A coolant passage 165 is formed over the ultrasonic-wave diffuser 162. The passage 165 is provided with a coolant supply port 166 through which the coolant is supplied and a coolant discharge port 167 through which the coolant is discharged. The number of coolant supply and discharge ports 166 and 167 is suitably selected depending on the size of the ultrasonic-wave washing unit 140. These ports 166 and 167 are connected to a source of coolant supply and a coolant discharge section (not shown) through the interior of the arm 132.

The measuring section 170 is provided with the non-contact distance sensor 171. The output of the sensor 171 is applied to the input of the control circuit 133 of the positioning mechanism 130. Thereupon, the circuit 133 causes the up-and-down motion mechanism 131 to control the vertical position of the arm 132.

The following is a description of the length of the support portion 161 in the direction of the arrow Y. As shown in FIG. 17, the length of the support portion 161 is a little greater than the width of the to-be-washed object (e.g., glass substrate for liquid crystal display) W. As the object W passes once under the ultrasonic-wave application section 160 in this arrangement, its whole surface can be washed in the main.

However, the length of the support portion 161 may be suitably changed depending on the size of the to-be-washed-object W. The support portion 161 may be reduced in size so that ultrasonic vibration can be applied spottedly. A region G indicated by broken line in FIG. 17 represents a portion in which the ultrasonic-wave diffuser 162 and the object W connect with each other by means of the detergent L.

The following is a description of the principle of washing in the ultrasonic-wave washing apparatus 110. The to-be-washed surface Wa of the to-be-washed object W and the ultrasonic-wave diffuser 162 of the ultrasonic-wave application section 160 are brought close to each other so that the gap δ between them is about 2 to 3 mm, and the detergent L is supplied to the gap. If this is done, the detergent L touches the diffuser 162 and uses its surface tension to form a convex on the diffuser 162, as shown in FIG. 16. On the other hand, vibration that is produced by the ultrasonic-wave vibrator 163 reaches the diffuser 162. Ultrasonic waves P having reached the diffuser 162 are radially diffused by the curved convex of the diffuser 162 and applied to the detergent L.

The following is a description of a washing method that utilizes the ultrasonic-wave washing apparatus 110 constructed in this manner. The arm 132 is lowered so that the ultrasonic-wave washing unit 140 approaches the transportation mechanism 120 in accordance with the thickness of the to-be-washed object W and the given gap δ. Subsequently, the object W is transported by means of the transportation mechanism 120. Thereupon, the given gap δ is substantially maintained between the surface of the object W and the apex of the ultrasonic-wave diffuser 162 of the ultrasonic-wave application section 160. At the same time, the non-contact distance sensor 171 measures the distance between the surface of the object W and the diffuser 162 of the application section 160. As the resulting value is applied to the input of the positioning mechanism 130, the up-and-down motion mechanism 131 is controlled so that the gap δ can always be kept within an appropriate range.

Further, the detergent L is supplied to the to-be-washed surface Wa of the to-be-washed object W through the nozzles 151a to 151f. When the detergent L is fed in a given quantity onto the surface Wa, it fills the gap between the ultrasonic-wave diffuser 162 and the surface Wa and connects them in the region G, as shown in FIG. 16. If the ultrasonic-wave vibrator 163 is actuated in this state, ultrasonic vibration caused by the ultrasonic waves P is transmitted to the surface Wa of the object W through the diffuser 162 and the detergent L. Thus, the vibration can remove particles and the like that adhere to the surface Wa.

If the ultrasonic-wave washing is carried out in this manner by using the ultrasonic-wave washing apparatus 110 according to the present embodiment, the ultrasonic-wave diffuser 162 and the to-be-washed surface Wa of the to-be-washed object W can be prevented from touching each other even though the object W is undulating or its thickness is uneven. Thus, the gap δ can be narrowed to enhance the utility of the detergent.

Figure 18:
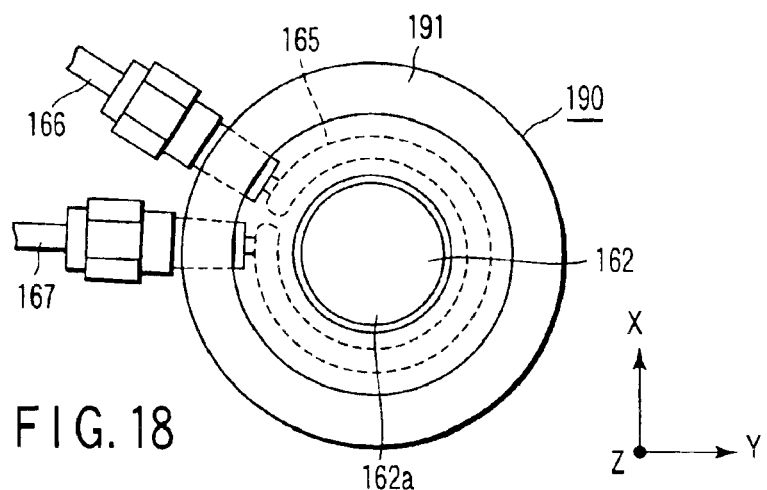
FIG. 18 is a bottom view showing a modification of the ultrasonic-wave washing unit.

FIG. 18 is a bottom view showing an ultrasonic-wave application section 190 according to a modification of the ultrasonic-wave application section 160 that can apply ultrasonic waves in spots. The profile of the application section 190 resembles that of the application section 160 described above. Like numerals are used to designate portions that have the same functions, and a description of those portions is omitted. A support portion 191 of the application section 190 is ring-shaped.

This configuration can produce the same effect of the ultrasonic-wave washing apparatus 110 that uses the ultrasonic-wave application section 160.

The present invention is not limited to the embodiments described above. According to the above-described embodiments, the ultrasonic-wave application means has a straight configuration, as shown in FIGS. 15 to 17, or is designed to be able to apply ultrasonic waves in spots, as shown in FIG. 18. However, these configurations may be combined freely and suitably used as required with the same effect. Besides, it is to be understood that various changes and modifications may be effected in the invention without departing from the scope or spirit of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic-wave washing unit comprising:
   an ultrasonic-wave vibrator;
   a diffusion means which diffuses ultrasonic vibration generated by means of the ultrasonic-wave vibrator; and
   a cooling means which cools the diffusion means.

2. An ultrasonic-wave washing unit according to claim 1, wherein the diffusion means has an ultrasonic-wave vibrating plate to which the ultrasonic-wave vibrator is fixed and an ultrasonic-wave transmission plate opposed to the ultrasonic-wave vibrating plate, and the cooling means has liquid supply means which supplies a liquid to a space defined between the ultrasonic-wave vibrating plate and the ultrasonic-wave transmission plate and liquid discharge means for discharging the liquid from the space.

3. An ultrasonic-wave washing unit according to claim 2, wherein the ultrasonic-wave transmission plate has a function to diffuse ultrasonic vibration propagated through the liquid in the space from the ultrasonic-wave vibrating plate.

4. An ultrasonic-wave washing apparatus which comprises a retaining means which holds a to-be-washed object and an ultrasonic-wave washing unit movable relatively to a to-be-washed surface of the object,
   the ultrasonic-wave washing unit having a diffusion means, which has one surface to which an ultrasonic-wave vibrator is fixed and the other surface opposed to the to-be-washed object and diffuses ultrasonic vibration from the ultrasonic-wave vibrator, and a cooling means which cools the diffusion means,
   the ultrasonic-wave washing apparatus further comprising a detergent supply means which supplies a detergent to the to-be-washed surface.

5. An ultrasonic-wave washing apparatus according to claim 4, wherein the diffusion means has an ultrasonic-wave transmission plate having one surface opposed to the to-be-washed object and an ultrasonic-wave vibrating plate having one surface opposed to the other surface of the ultrasonic-wave transmission plate and the other end fixedly fitted with the ultrasonic-wave vibrator, and the cooling means has a liquid supply-means which supplies a liquid to a space defined between the ultrasonic-wave vibrating plate and the ultrasonic-wave transmission plate and liquid discharge means for discharging the liquid from the space.

6. An ultrasonic-wave washing apparatus according to claim 5, wherein the ultrasonic-wave transmission plate has a function to diffuse and propagate to the to-be-washed object ultrasonic vibration propagated through the liquid in the space from the ultrasonic-wave vibrating plate.

7. An ultrasonic-wave washing apparatus which washes a to-be-washed surface of a to-be-washed object with a detergent to which ultrasonic waves are applied, comprising:
   a retaining means which holds the to-be-washed object;
   an ultrasonic-wave washing unit opposed to the to-be-washed surface of the to-be-washed object held by the retaining means; and
   a positioning means which positions the ultrasonic-wave washing unit with respect to the to-be-washed surface of the to-be-washed object,
   the ultrasonic-wave washing unit including a diffusion means which has one surface to which an ultrasonic-wave vibrator is fixed and the other surface opposed to the to-be-washed object and diffuses ultrasonic vibration from the ultrasonic-wave vibrator;
   a detergent supply means which supplies a detergent to the to-be-washed surface of the to-be-washed object; and
   a measuring means which measures a relative distance between the diffusion means and the to-be-washed surface,
   the positioning means having a control means which positions the ultrasonic-wave washing unit so as to maintain a given distance between the diffusion means and the to-be-washed surface in accordance with the output of the measuring means.

8. An ultrasonic-wave washing apparatus according to claim 7, wherein the measuring means is located in the direction of advance of the ultrasonic-wave washing unit.

* * * * *